US00RE35305E

United States Patent [19]

Perroud et al.

[11] E Patent Number: Re. 35,305

[45] Reissued Date of Patent: Jul. 30, 1996

[54] AMPLIFICATION CIRCUIT WITH A DETERMINED INPUT IMPEDANCE AND VARIOUS TRANSCONDUCTANCE VALUES

[75] Inventors: Philippe Perroud, Meylan; Jean-Luc Jaffard, Saint-Egreve, both of France

[73] Assignee: SGS-Thomson Microelectronics, S.A., Gentilly Cedex, France

[21] Appl. No.: 117,585

[22] Filed: Sep. 3, 1993

Related U.S. Patent Documents

Reissue of:

[64] Patent No.: 5,045,803
Issued: Sep. 3, 1991
Appl. No.: 567,580
Filed: Aug. 15, 1990

[30] Foreign Application Priority Data

Aug. 16, 1989 [FR] France ..... 89 11226

[51] Int. Cl.[6] ..... H03F 1/14

[52] U.S. Cl. ..... 330/51; 348/707

[58] Field of Search ..... 330/51, 69, 85, 330/124 R, 295; 348/659, 707

[56] References Cited

U.S. PATENT DOCUMENTS 3,681,699 8/1972 Kelly et al. ..... 328/143
3,729,666 4/1973 Kelly ..... 358/30
4,104,678 8/1978 Van Roessel ..... 358/30

FOREIGN PATENT DOCUMENTS 2829110 10/1976 France .

OTHER PUBLICATIONS

Nuclear Instruments and Methods, 37 (1965) 58–60 (North–Holland Publishing Co.), "A Transistorized Linear Gate", E. Elad and S. Rozen, AEC of Israel, Hakirya Tel–Aviv, Israel.

*Primary Examiner*—Steven Mottola
*Attorney, Agent, or Firm*—Betty Formby; Robert Groover

[57] ABSTRACT

A voltage-current amplification circuit comprises two sub-circuits (B1, B2), each of which comprises a differential amplifier (D), a resistor (R4), a transistor (T), and a first switch (K1) connected between the transistor base and ground. Each sub-circuit (B1, B2) also comprises an additional amplifier (A1, A2), and an additional resistor (R2a, R2b), respectively. The inputs of the additional amplifiers being connected to ground through a common resistor (R) and to the emitters of the two transistors through a common resistor (R1). Each sub-circuit further comprises a second switch (K2) formed by a single transistor.

20 Claims, 1 Drawing Sheet

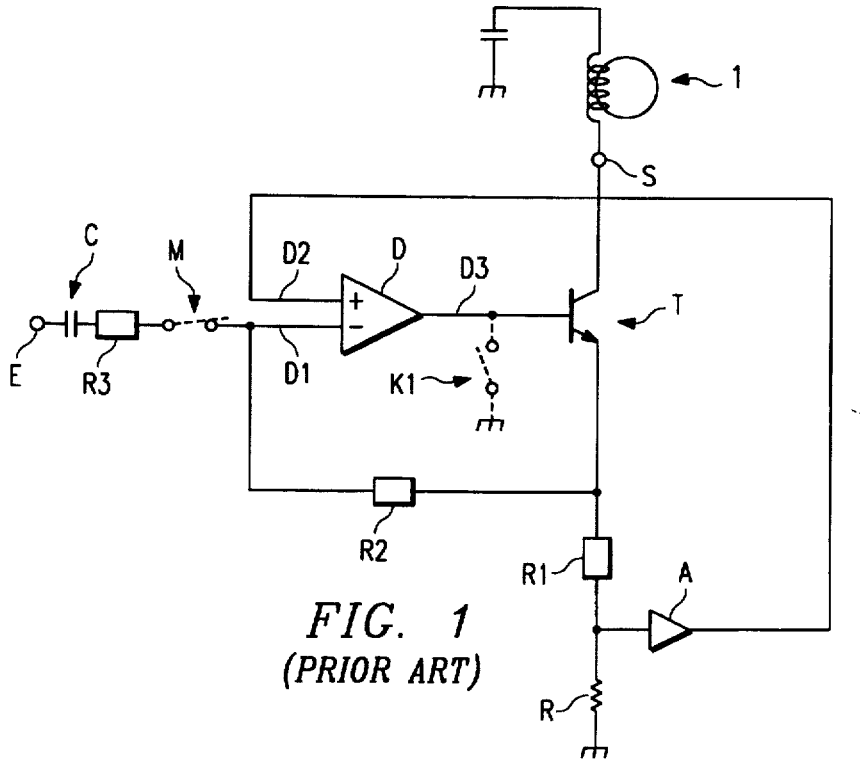
FIG. 1
(PRIOR ART)
FIG. 2
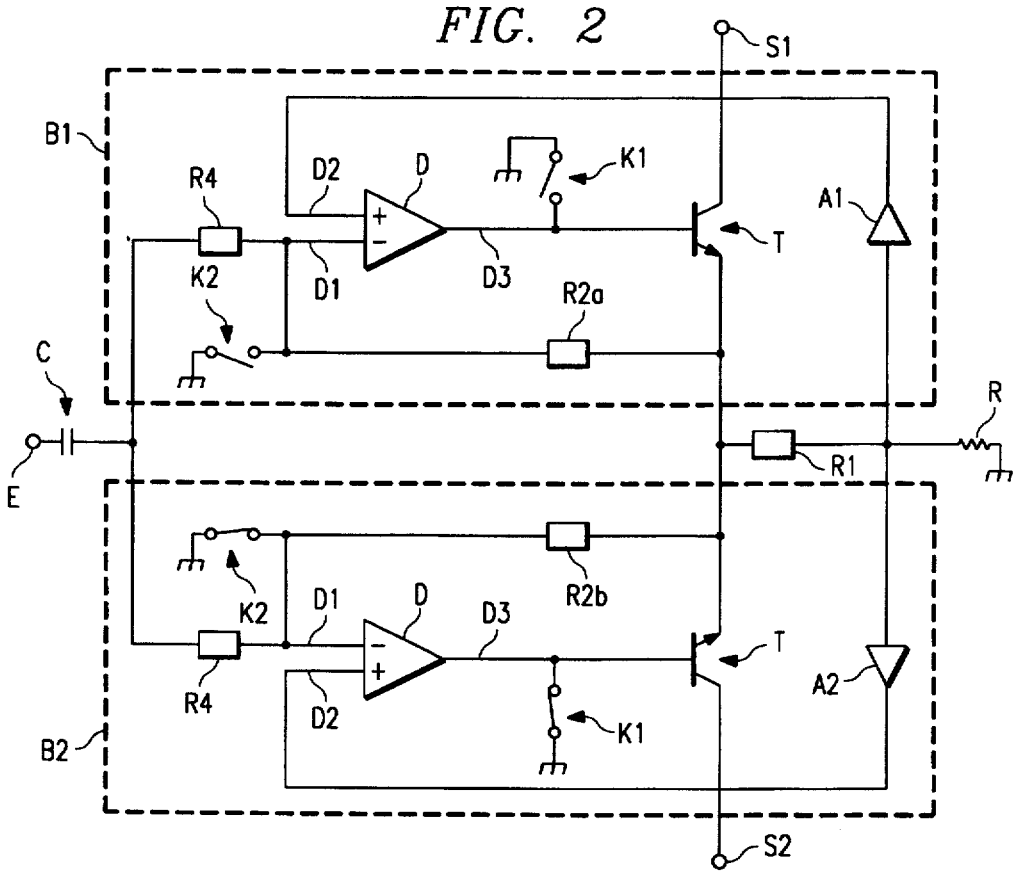

AMPLIFICATION CIRCUIT WITH A DETERMINED INPUT IMPEDANCE AND VARIOUS TRANSCONDUCTANCE VALUES

Matter enclosed in heavy brackets [ ] appears in the original patent but forms no part of this reissue specification; matter printed in italics indicates the additions made by reissue.

*This is a reissue of U.S. Pat. No. 5,045,803.*

BACKGROUND OF THE INVENTION

The present invention relates to voltage amplification circuits supplying a current at the output, and more particularly to amplification circuits designed to control the heads of the video tape recorders having various characteristics.

Some video tape recorders (VTRs) comprise four heads, two for a "normal duration" mode and two for a "long duration mode". Those four heads serve both for writing and reading. In operation, the two heads associated with the selected mode alternatively write or read data on a magnetic tape.

During recording, the voltage signals designed to be recorded are sent by a signal processor towards an amplification circuit supplying a current at the outputs connected to the VTR heads.

In such an amplification circuit, it is [tried] *desired* to accurately optimize and determine the transconductance which is the ratio between the output current and the input voltage for obtaining an optimum recording quality. It is also [tried] *desired* to accurately determine the input impedance for realizing a satisfactory impedance matching.

A single-head amplification circuit that meets those two requirements is mentioned in Digest of ICCF 1988 and is shown in FIG. I. A coupling capacitor C is connected to the input terminal E of the circuit and transmits only high frequency signals. A differential amplifier D has a first input D1 connected to the coupling capacitor through a resistor R3, and its output D3 is connected to the base of an NPN transistor, the collector of which is connected to the output terminal S in turn connected to a head 1 of a VTR. An amplifier A has its input connected to the transistor emitter through a resistor R1 to ground through a protection resistor R, and its output connected to the second input D2 of the differential amplifier. A resistor R2 is connected between the input D1 of the differential amplifier and the transistor emitter.

The transconductance Tr of this circuit, in the event the gain of amplifier A is R3/(R2+R3), is expressed by:

$$Tr=(R1+R2)/(R1\times R3) \quad (1)$$

Values, R1=10Ω, R2=1Ω and R3=1.5 kΩ, for example, are chosen for optimizing this transconductance. Moreover, resistors R1, R2 and R3 are external and not integrated in order to be determined with a high accuracy as well as for optimizing the transconductance. For this circuit, the value of the protection resistor R which is integrated and determined with less accuracy has no effect on the transconductance value.

The input impedance of this circuit is equal to R3.

A method for realizing an amplification circuit permitting control of one of two heads having different characteristics is to provide two elementary circuits analogous to that of FIG. 1 having common resistors R and R1. The differential amplifiers and transistors are identical in the two elementary circuits. Amplifier A becomes an amplifier A1 is one of the elementary circuits and an amplifier A2 in the other. Those amplifiers A1 and A2 have their inputs connected to each other. Each of the two circuit outputs is connected to a different head.

A switch K1, shown in dotted lines in FIG. 1, is added in each of the elementary circuits. This switch is connected between the transistor base and ground and is constituted by a single transistor which is saturated when switched on.

Moreover, it is possible, to add an external switch between the common coupling capacitor and the two resistor R3, but such a switch is expensive and not integrated. Another approach consists in replacing the external switch by a switch M shown in dotted lines between resistor R3 and the input D1 of the differential amplifier in each elementary circuit. This switch can be integrated but, since it has no [gronded]*ground* terminal, it has to be constituted by a circuit comprising several transistors (seven transistors).

In order to write through one of the heads, switch M is switched on and switch K1 of the circuit associated with the selected head is switched off, and the switches [that are]*in the current that is* to be rendered inactive are set to reverse position. Switching on a switch K1 connects the transistor base to the ground and current no longer flows through this transistor.

If two resistors R3 identical to the one of FIG. 1 are selected, the input impedance will still be equal to R3/2 when either elementary sub-circuit will be rendered inactive.

Considering in the elementary circuit comprising the amplifier A1 a resistor R2a and in the other elementary circuit a different resistor R2b instead of resistor R2, and if the gains of amplifiers A1 and A2 are chosen equal to R3/(R2a+R3) an R3/(R2B+R3), respectively, two R-independent transconductances are obtained:

$$Tra=(R1+R2a)/(R1\times R3)$$

$$Trb=(R1+R2b)/(R1\times R3)$$

However, providing an integrated switch M involves the provision of an additional pad for each elementary circuit, since resistors R2a, R2b and R3 are external. Thus, a pad between resistor R3 and the integrated circuit, and a pad between the integrated circuit and the terminal of resistor R2a (R2b) connected to the input D1 of the differential amplifier are to be provided. Without switch M, resistors R3 and R2 were connected to each other and a single pad was necessary for connecting them to input D1.

Thus, an object of the invention is to provide for an amplification circuit with a determined input impedance having two different transconductance values wherein no additional pad is added.

A further object of the invention is to provide such an amplification circuit comprising fewer transistors.

BRIEF SUMMARY OF THE INVENTION

To achieve those objects, the invention provides for a voltage-current amplification circuit connected between an input terminal, and either first and second output terminal comprising first and second sub-circuits, each of which comprises a first differential amplifier, a first input of which is connected to the input terminal through a first resistor, a transistor, the base of which is connected to the output of the differential amplifier, and a first switch connected between the transistor base and the ground. The first sub-circuit also comprises a second amplifier, the output of which is connected to the second input of the differential amplifier, and a second resistor connected between the transistor emitter and the first input of the differential amplifier. The second sub-circuit also comprises a third amplifier, the output of which is connected to the second input of the differential amplifier, and a third resistor connected between the transistor emitter and the first differential amplifier input. The transistor collectors of the first and second sub-circuits are connected to the first and second output terminals, respectively, and the inputs of the second and third amplifiers are connected to ground through a fourth common resistor and to the emitters of the two transistors through a common fifth resistor. Each sub-circuit further comprises a second switch connected between the first input of the differential amplifier and ground, this second switch comprising a single transistor saturated when switched on.

BRIEF DISCLOSURE OF THE DRAWINGS

The foregoing and other objects, features and advantages of the invention will be apparent from the following detailed description of a preferred embodiment as illustrated in the accompanying drawings wherein:

FIG. 1, already described, shows a single output amplification circuit according to the prior art; and FIG. 2 shows a two-outputs amplification circuit according to the invention.

DETAILED DESCRIPTION OF THE INVENTION

FIG. 2 shows a voltage-current amplification circuit connected between an input terminal E and either out-put terminal S1 or S2 according to the invention, two heads having different characteristics being connected to output S1 or S2. Two sub-circuits B1 and B2 comprise a differential amplifier D, a first input D1 of which is connected, through a resistor R4, to a terminal of a coupling capacitor C, the other terminal of which is connected to the circuit input E. Each sub-circuit further comprises a transistor T, the base of which is connected to the output D3 of the differential amplifier, and a switch K1 which is connected between the transistor base and ground and which can be constituted by a single transistor set in saturation mode when switched on.

Moreover, the sub-circuits B1 and B2, respectively, comprise an amplifier A1, A2, the output of which is connected to the second input D2 of the associated differential amplifier. The sub-circuits also respectively comprise a resistor R2a, R2b, connected between the emitter of the associated transistor and the first input D1 of the corresponding differential amplifier.

The transistor collectors of the two sub-circuits B1, B2 are each connected to an output terminal S1, S2, respectively. The inputs of amplifiers A1 and A2 are connected to ground through a common protection resistor R, and, to the emitters of the two transistors through a common resistor R1.

The two sub-circuits further comprise a switch K2 which is connected between the input D1 of the differential amplifier and ground and which is constituted by a single transistor set to saturation mode when switched on.

In FIG. 2, switches K1 and K2 of sub-circuit B2 are switched on, therefore, the base of transistor T is grounded and no current flows in this transistor. But, switches K1 and K2 of sub-circuit B1 are switched off. This configuration corresponds to an active sub-circuit B1 and an inactive sub-circuit B2.

In that case, the sum of resistors R and R1 is in parallel with resistor R22. Those resistors have for example the following values: R=1Ω, R1=10Ω and R2b1 Ω. The equivalent resistor is then substantially equal to R+R1. Transconductance Tr1 associated with sub-circuit B1 is therefore obtained by replacing in relation (1) resistor R2 by resistor R2a, provided the gain of amplifier A1 is equal to R4/(R2a+R4):

$$Tr1=(R1+R2a)/(R1\times R4).$$

Moreover, the input impedance of the amplification circuit can be deduced from the circuit of FIG 1 by making the correspondence between resistor R4 of sub-circuit B1 and resistor R3 and by adding in parallel resistor R4 of sub-circuit B2. By choosing both resistors R4 identical, the input impedance is then equal to R4/2.

In order to render sub-circuit B2 active and sub-circuit B1 inactive, switches K1 and K2 of sub-circuit B1 are switched on and switches K1 and K2 of sub-circuit B2 are switched off. The transconductance associated with sub-circuit B2, provided the gain of amplifier A2 is equal to R4/(R2b+R4), is then:

$$Tr2=(R1+R2b)/R1\times R4).$$

The input impedance is still R4/2.

Thus, the amplification circuit exhibits two different transconductances which can be optimized for each head by properly selecting resistors R2a and R2b. Those two transconductances do not depend upon the integrated protection resistor R and they can be accurately determined by choosing external resistors R1, R2a, R2b and R4.

The input impedance is also determined and is equal to R4/2. It is possible to select R4=2×R3 to obtain again the input impedance of the circuit of FIG. 1.

The single transistor forming each switch K2 can be integrated and its implantation does not need any additional pad since it is directly connected to the input of the associated differential amplifier which is in turn integrated, and to ground.

Moreover, the number of transistors in the circuit of FIG. 2 is reduced since two switches comprising a single transistor replace two switches provided with seven transistors.

We claim:

1. A voltage-current amplification circuit connected between an input terminal and first or second output terminals, said circuit comprising first and second sub-circuits, each sub-circuit comprising:

(a) a first differential amplifier, a first input of which is connected to the input terminal through a first resistor, (b) a transistor, [the] having a base connected to the output of the differential amplifier and having an emitter and a collector, and, (c) a first switch connected between the transistor base and ground, the first sub-circuit comprising a second amplifier, the output of which is connected to a second input of the differential amplifier, and a second resistor connected between the transistor emitter and the first input of the differential amplifier, the second sub-circuit comprising a third amplifier, the output of which is connected to the second input of the differential amplifier, and a third resistor connected between the transistor emitter and the first input of the differential amplifier, the transistor collectors of the first and second sub-circuits being connected to the first and second output terminals, respectively, and the inputs of the second and third amplifiers being connected to ground through a common fourth resistor and to the emitters of the two transistors through a common fifth resistor, wherein each said first and second sub-circuits further comprises a second switch connected between the first input of the differential amplifier and ground, each of said second switches being formed by a single transistor.

2. An amplification circuit according to claim 1, wherein each said first and second output terminals is connected to a different VTR head adapted respectively to a "normal duration" or "long duration" mode.

3. An amplication circuit according to claim 1, wherein gains of the second and third amplifiers are equal to R4/(R2a+R4) and R4/(R2b+R4), respectively, where R4 is the resistance value of the first resistor, R2a is the resistance value of the second resistor and R2b is the resistance value of the third resistor.

4. An amplification circuit according to claim 1, wherein each first switch is formed by a single transistor set to saturation mode when switched on.

*5. An amplification circuit, connected between an input terminal and first or second output terminals, comprising:*

*first and second sub-circuits each including:*

*(a) a first differential amplifier, a first input of which is connected to the said input terminal through a first resistor,*

*(b) a transistor having a control terminal thereof connected to an output of said differential amplifier, and having first and second current-carrying terminals; and*

*(c) a first switch connected between said control terminal and a reference potential;*

*said first sub-circuit further comprising a second amplifier, having an output thereof connected to a second input of said respective differential amplifier, and a second resistor connected between said first current-carrying terminal and said first input of said respective differential amplifier,*

*said second sub-circuit further comprising a third amplifier having an output thereof connected to a second input of said respective differential amplifier, and a third resistor connected between said first current-carrying terminal and said first input of said respective differential amplifier,*

*said second current-carrying terminals of said respective transistors of the first and second sub-circuits being connected to said first and second output terminals, respectively, and said inputs of the second and third amplifiers being connected to said reference potential through a common fourth resistor and to said respective first current-carrying terminals through a common fifth resistor,*

*wherein each of said first and second sub-circuits further comprises a second switch connected between the first input of the differential amplifier and said reference potential, each of said second switches being formed by a single transistor.*

*6. The circuit of claim 5, wherein said transistor is bipolar, and said first and second current-carrying terminals thereof correspond to an emitter thereof and a collector thereof respectively.*

*7. The circuit of claim 5, wherein each said first and second output terminals is connected to a different VTR head adapted respectively to a "normal duration" or "long duration" mode.*

*8. The circuit of claim 5, wherein gains of said second and third amplifiers are equal to R4/(R2a+R4) and R4/(R2b+R4), respectively, where R4 is the resistance value of the first resistor, R2a is the resistance value of the second resistor and R2b is the resistance value of the third resistor.*

*9. The circuit of claim 5, wherein each first switch is formed by a single transistor connected and configured to operate in saturation mode when switched on.*

*10. An amplification circuit, connected between an input terminal and first or second output terminals, comprising:*

*first and second sub-circuits each including:*

*(a) a first differential amplifier, a first input of which is connected to said input terminal through a first resistor,*

*(b) a transistor having a base connected to the output of the differential amplifier and having an emitter and a collector, and,*

*(c) a first switch connected between said base and a reference potential;*

*said first sub-circuit further comprising a second amplifier, having an output thereof connected to a second input of said respective differential amplifier, and a second resistor connected between said emitter and said first input of said respective differential amplifier,*

*said second sub-circuit further comprising a third amplifier having an output thereof connected to a second input of said respective differential amplifier, and a third resistor connected between said emitter and said first input of said respective differential amplifier,*

*said collectors of said respective transistors of the first and second sub-circuits being connected to said first and second output terminals, respectively, and said inputs of the second and third amplifiers being connected to said reference potential through a common fourth resistor and to said respective emitter through a common fifth resistor,*

*wherein each of said first and second sub-circuits further comprises a second switch connected between the first input of the differential amplifier and said reference potential.*

*11. The circuit of claim 10, wherein each said first and second output terminals is connected to a different VTR head adapted respectively to a "normal duration" or "long duration" mode.*

*12. The circuit of claim 10, wherein said second switch consists of a single transistor.*

*13. The circuit of claim 10, wherein gains of said second and third amplifiers are equal to R4/(R2a+R4) and R4/(R2b+R4), respectively, where R4 is the resistance value of the first resistor, R2a is the resistance value of the second resistor and R2b is the resistance value of the third resistor.*

*14. The circuit of claim 10, wherein each first switch is formed by a single transistor connected and configured to operate in saturation mode when switched on.*

*15. An amplification circuit, connected between an input terminal and first or second output terminals, comprising:*

*first and second sub-circuits each including:*

*(a) a first differential amplifier, a first input of which is connected to said input terminal through a first resistor,*

*(b) a transistor having a control terminal thereof connected to an output of said differential amplifier, and having first and second current-carrying terminals; and*

(c) *a first switch connected between said control terminal and a reference potential;*

*said first sub-circuit further comprising a second amplifier, having an output thereof connected to a second input of said respective differential amplifier, and a second resistor connected between said first current-carrying terminal and said first input of said respective differential amplifier,*

*said second sub-circuit further comprising a third amplifier having an output thereof connected to a second input of said respective differential amplifier, and a third resistor connected between said first current-carrying terminal and said first input of said respective differential amplifier,*

*said second current-carrying terminals of said respective transistors of the first and second sub-circuits being connected to said first and second output terminals, respectively, and said inputs of the second and third amplifiers being jointly connected to said reference potential through a fourth resistor and to said respective first current-carrying terminals through a fifth resistor,*

*wherein each of said first and second sub-circuits further comprises a second switch connected between the first input of the differential amplifier and said reference potential.*

*16. The circuit of claim 15, wherein said transistor is bipolar, and said first and second current-carrying terminals thereof correspond to an emitter thereof and a collector thereof respectively.*

*17. The circuit of claim 15, wherein each said first and second output terminals is connected to a different VTR head adapted respectively to a "normal duration" or "long duration" mode.*

*18. The circuit of claim 15, wherein said transistor is bipolar, and said first and second current-carrying terminals thereof correspond to an emitter thereof and a collector thereof respectively, and wherein said second switch consists of a single transistor.*

*19. The circuit of claim 15, wherein gains of said second and third amplifiers are equal to R4/(R2a+R4) and R4/(R2b+R4), respectively, where R4 is the resistance value of the first resistor, R2a is the resistance value of the second resistor and R2b is the resistance value of the third resistor.*

*20. The circuit of claim 15, wherein each first switch is formed by a single transistor connected and configured to operate in saturation mode when switched on.*

* * * * *